United States Patent [19]

Sullivan et al.

[11] Patent Number: 5,391,914
[45] Date of Patent: Feb. 21, 1995

[54] DIAMOND MULTILAYER MULTICHIP MODULE SUBSTRATE

[75] Inventors: Patrick M. Sullivan, San Diego; Pat H. Reaves, Escondido, both of Calif.

[73] Assignee: The United States of America as represented by the Secretary of the Navy, Washington, D.C.

[21] Appl. No.: 215,799

[22] Filed: Mar. 16, 1994

[51] Int. Cl.$^6$ .................. H01L 29/34; H01L 39/02
[52] U.S. Cl. .................. 257/635; 257/77; 257/676; 257/758; 257/763; 257/774; 257/776
[58] Field of Search .................. 257/77, 635, 676, 750, 257/758, 763, 774, 776

[56] References Cited

U.S. PATENT DOCUMENTS

| | | |
|---|---|---|
| 3,809,797 | 5/1974 | McMunn, III et al. . |
| 4,513,355 | 4/1985 | Schroeder et al. . |
| 4,705,606 | 11/1987 | Young et al. . |
| 4,764,804 | 8/1988 | Sahara et al. . |
| 4,796,077 | 1/1989 | Takeda et al. . |
| 4,855,808 | 8/1989 | Tower et al. . |
| 4,914,551 | 4/1990 | Anschel et al. . |
| 4,922,324 | 5/1990 | Sudo . |
| 4,930,002 | 5/1990 | Takenaka et al. . |
| 4,965,702 | 10/1990 | Lott et al. . |
| 5,075,764 | 12/1991 | Yamazaki . |
| 5,111,278 | 5/1992 | Eichelberger . |
| 5,134,539 | 7/1992 | Tuckerman et al. . |
| 5,188,985 | 2/1993 | Medeiros, III et al. . |

*Primary Examiner*—Ngan V. Ngo
*Attorney, Agent, or Firm*—Harvey Fendelman; Thomas Glenn Keough; Peter A. Lipovsky

[57] ABSTRACT

Diamond is used as a dielectric layer to separate the metalization layers in multichip module substrates. The diamond has use for both electrical and thermal conduction. Such multichip module substrates may have a diamond base, or a base constructed from silicon, aluminum nitride, molybdenum, or any other material supportive of the nucleation and growth of diamond films. The metalization may be molybdenum or other conductor supportive of the nucleation and growth of diamond films. Using diamond as an interlayer dielectric in a multichip system permits a significant increase in the amount of power that can be dissipated by the system. The diamond does not obstruct the system's metalization, so that routing density can be increased and interconnection length may be decreased, enhancing host chip operation.

18 Claims, 2 Drawing Sheets

DIAMOND MULTILAYER MULTICHIP MODULE SUBSTRATE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention relates generally to multilayer, multichip module substrates. More particularly, the invention relates to a multilayer, multichip module substrate designed for enhanced heat dissipation.

2. Description of the Related Art

Heat transfer is an important consideration in electronics design and hence the design of multichip module substrates. The use of high density, high clock rate circuits, especially microcircuits and high-interconnect-density printed wiring assemblies, has been discouraged by the lack of effective heat removal.

A number of techniques have been devised to transfer heat from electronics. In U.S. Pat. No. 5,111,278, a multichip module system is described that includes thermal vias or channels to facilitate heat removal. The device disclosed in U.S. Pat. No. 4,764,804 uses a number of "bump" electrodes that are placed between chips to serve as heat transfer elements.

Since the thermal conductivity of typical chip dielectrics is poor, the thermal vias or bumps are placed directly under the chips populating the multichip module substrate. The vias or bumps provide a thermal path from the chips to the substrate, however they severely limit the routing density of the metalization underlying the chips.

In multichip module substrates made by the multichip module D (MCM-D) process, polyimides and silicon dioxide have been used as dielectric layer materials. Polyimides have a thermal conductivity on the order of 0.2 W/(m-K). Silicon dioxide has a thermal conductivity of 1.4 W/(m-K). These thermal conductivities impose severe design constraints on a multichip system.

A need exists for a multichip module substrate that dissipates more heat for the same area/volume allowing denser, higher speed, higher power electronic systems to operate within acceptable temperature ranges or allowing less dense, lower power, lower speed electronic systems to operate at lower operating temperatures.

SUMMARY OF THE INVENTION

The invention uses diamond dielectric layers to separate metalization layers in a multichip module substrate. The diamond may be used for both electrical isolation as well as thermal conduction. This multichip module substrate may have a base of diamond, or a base constructed of silicon, aluminum nitride, molybdenum, or other material that supports the nucleation and growth of diamond films. The metalization may be of molybdenum, or any other conductor that can support the nucleation and growth of diamond films.

Using diamond as an interlayer dielectric in a multichip system permits a significant increase in the amount of power that can be dissipated by the system. As the diamond does not obstruct the underlying metalization, routing density can be increased and interconnection length decreased, improving host chip operation.

The diamond films used in the invention can be deposited by any suitable method. These methods include, for example, DC glow discharge, DC plasma jet, RF plasma, or microwave plasma. Chemical vapor infiltration can be used to consolidate diamond grit into a continuous diamond film by infiltrating the grit with the carbon containing radicals used for diamond growth in the direct current, RF, or microwave plasma growth techniques. Vias in the diamond can be fabricated by laser drilling, selective deposition of diamond films, or other technique of providing holes in diamond films. The vias can then be filled with a suitable conductive material.

OBJECTS OF THE INVENTION

It is an object of this invention to provide an improved multichip module substrate.

Another object of this invention is to provide a multichip module substrate capable of conducting relatively large amounts of heat from chips populating the multichip module substrate.

Still another object of this invention is to provide an enhanced heat dissipating multichip module that permits relatively high interconnect routing density.

Yet still another object of this invention is to provide an enhanced heat dissipating multichip module that permits chips attached thereto to operate at relatively high speeds.

A further object of this invention is to provide an enhanced heat dissipating multichip module that permits chips attached thereto to operate at relatively high power.

Yet another object of this invention is to provide an enhanced heat dissipating multichip module that can accommodate high speed, high density, high power devices.

Still a further object of this invention is to provide an enhanced heat dissipating multichip module that permits chips attached thereto to operate at lower temperatures than possible with typical multichip modules.

Other objects, advantages and new features of this invention will become apparent from the following detailed description of the invention when considered in conjunction with the accompanying drawings.

DESCRIPTION OF THE PREFERRED EMBODIMENT

Figure 1:
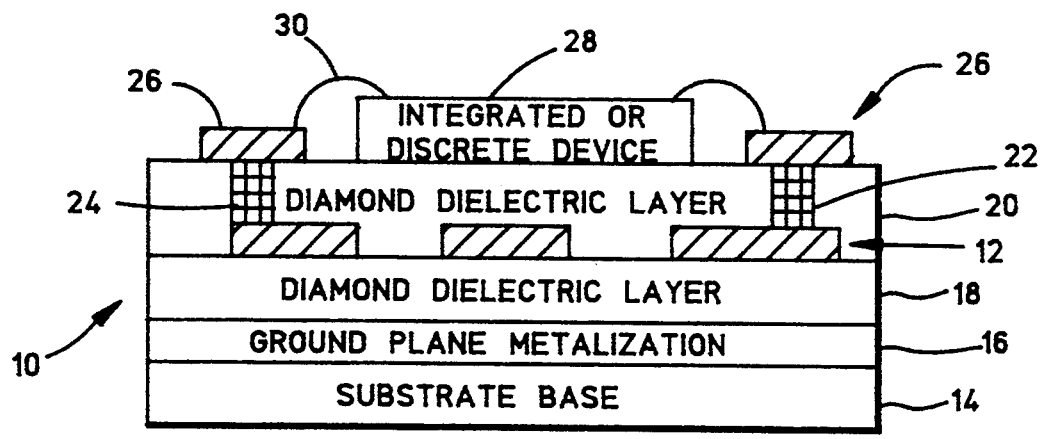
FIG. 1 is an x or y axis cross-sectional view of a single signal layer multichip module according to the invention.

Referring now to FIG. 1, a cross-section of a diamond multilayer multichip module substrate 10 according to one embodiment of the invention is shown. The cross-section could be of either the x or y axis of such a module. In the embodiment illustrated, a single signal layer 12 is shown. Multichip module substrate 10 has a substrate base 14 that is constructed of diamond or other material compatible with the nucleation and growth of diamond films. A ground plane metalization or conductive layer 16 is formed on base 14. Metalization layer 16 could be constructed of molybdenum or other conducting material that supports the nucleation and growth of diamond films.

Diamond dielectric layer 18 is formed on conductive layer 16 by any of a variety of methods. For example, by the direct current plasma-jet technique also known as the arc-jet method. This method deposits diamond at high growth rates onto anything where diamond forms a carbide. Another way of depositing such a layer is through the aid of a microwave plasma. This technique is described in U.S. Pat. No. 5,023,056 incorporated by reference herein. In addition, other plasma generating techniques could be used such as RF plasma and glow discharge. Any of these techniques can also be used to consolidate industrial diamond grit into a continuous diamond film through the process known as chemical vapor infiltration.

Signal layer 12 is a conductive layer deposited and patterned on the top of diamond dielectric layer 18 according to customary techniques. Diamond dielectric layer 20 is then formed on an upper side of diamond dielectric layer 18 covering patterned conductive layer 12. Holes 22 can be formed in diamond dielectric layer 20 by selective diamond deposition or by way of laser drilling or other technique of fabricating holes in diamond films.

Conductive vias 24 are formed within holes 22 either separately or coincident with the formation of signal/-pad metalizations 26. Integrated or discrete device 28 is then disposed on top of multilayer multichip module substrate 10 and is electrically coupled to pads 26 sufficient for device operation.

In the invention, diamond layers are used as a dielectric between buried metalization layers to isolate the metalization layers. Besides their dielectric function, the diamond layers are thermal conductors (roughly four orders or magnitude greater than polyimide and three orders of magnitude greater than silicon dioxide). When high density, high clock rate circuits and/or high interconnect density printed wiring assemblies populate multichip module 10, the enhanced heat transfer characteristics of the utilized diamond layers are of optimum value. The use of such diamond layers can eliminate the need for thermal vias or channels, increasing the routing density of underlying metalizations. The diamond's high thermal conductivity will also allow more power to be dissipated in a given area. Higher power chips could thus be utilized or chips of lower power could be operated at lower temperatures, increasing their reliability.

Figure 2:
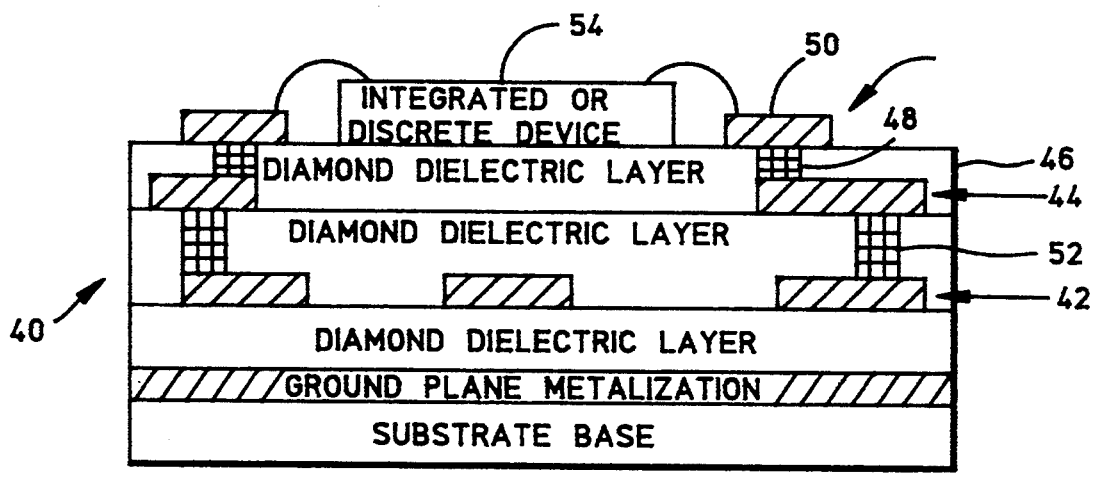
FIG. 2 is an x or y axis cross-sectional view of a multiple signal layer multichip module according to the invention.

In FIG. 2, a diamond multilayer multichip module substrate 40 is shown containing multiple signal layers 42 and 44. Multichip module 40 is constructed similarly to multichip module 10 of FIG. 1. Multichip substrate 40 includes an additional signal layer 44 and diamond layer 46 through which conductive vias 48 are used to connect bonding pads 50 to signal layer 44 and, in this embodiment, to signal layer 42 by way of vias 52. As in module 10, device or devices 54 are placed on the topmost layer of module 40 where appropriate electrical connections are made to bonding pads 50. Signal layers 42 and 44 permit multichip module 40 to have metalization in two (x and y) directions. Of course, one skilled in the art will realize that further signal/diamond layers are possible.

Figure 3:
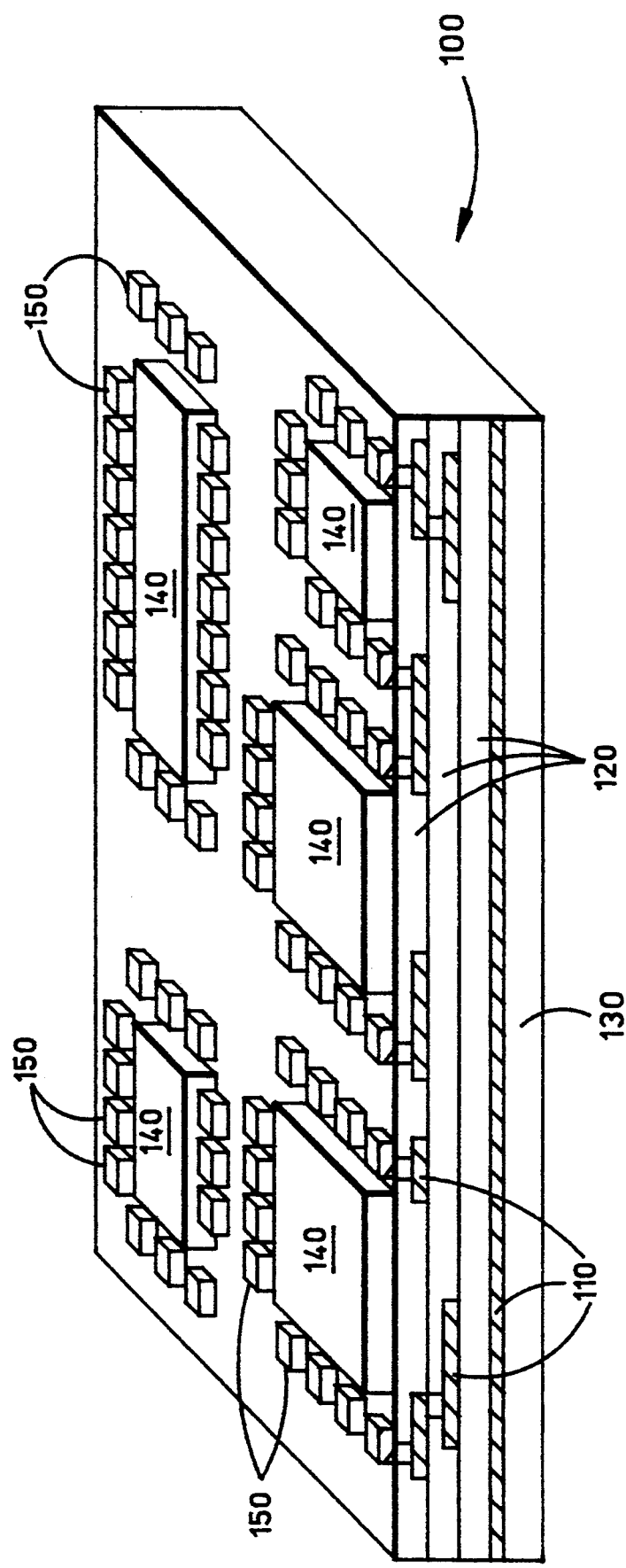
FIG. 3 is a three dimensional view of a cross-sectioned multiple signal layer multichip module according to the invention and like that shown in FIG. 2.

FIG. 3 shows a three dimensional view of a multiple signal layer multichip module 100 according to the invention. This three dimensional view has been cross-sectioned to show metalization layers 110 imbedded in diamond layers 120 according to the invention. Substrate 130 could also be of diamond or other material compatible with the nucleation and growth of diamond films. Atop module 100 are devices 140 appropriately connected to bonding pads 150.

Obviously, many modifications and variations of the invention are possible in light of the above teachings. It is therefore to be understood that within the scope of the appended claims the invention may be practiced other than as has been specifically described.

What is claimed is:

1. An apparatus comprising:
   a substrate base compatible with the nucleation and growth of diamond film;
   a metalization layer disposed on an upper side of said substrate base, said metalization layer being compatible with the nucleation and growth of diamond film;
   a first diamond dielectric layer disposed on an upper side of said metalization layer;
   a patterned metalization layer disposed on said first diamond dielectric layer, said patterned metalization layer being compatible with the nucleation and growth of diamond film;
   a second diamond dielectric layer disposed on an upper side of said first diamond dielectric layer and covering said patterned metalization layer;
   metalization pads disposed on an upper surface of said second diamond dielectric layer; and
   conductive vias disposed within said second diamond dielectric layer, said conductive vias being an electrical coupling between said patterned metalization layer and at least one of said metalization pads.

2. An apparatus according to claim 1 in which said substrate base includes diamond.

3. An apparatus according to claim 1 further including
   an electrical device disposed on an upper surface of said second diamond dielectric layer, said electrical device being operably connected to at least one of said metalization pads.

4. An apparatus according to claim 3 in which said electrical device is an integrated device.

5. An apparatus according to claim 3 in which said electrical device is a discrete device.

6. An apparatus according to claim 3 in which said substrate base includes diamond.

7. An apparatus according to claim 6 in which said electrical device is an integrated device.

8. An apparatus according to claim 6 in which said electrical device is a discrete device.

9. An apparatus according to claim 1 wherein said first and second diamond dielectric layers include polycrystalline diamond.

10. An apparatus according to claim 1 in which said metallization layer includes molybdenum.

11. An apparatus comprising:
    a diamond substrate base;
    a ground-plane conductive layer disposed on an upper side of said diamond substrate base, said ground-plane conductive layer being compatible with the nucleation and growth of polycrystalline diamond film;

a first polycrystalline diamond dielectric layer disposed on an upper side of said ground-plane conductive layer;

a patterned conductive layer disposed on said first polycrystalline diamond dielectric layer;

a second polycrystalline diamond dielectric layer disposed on an upper side of said first polycrystalline diamond dielectric layer and covering said patterned conductive layer;

conductive bonding pads disposed on an upper surface of said second polycrystalline diamond dielectric layer; and conductive vias disposed within said second polycrystalline diamond dielectric layer, said conductive vias electrically coupling said patterned conductive layer with at least one of said conductive bonding pads.

12. An apparatus according to claim 11 further including at least one electrical device disposed on an upper surface of said second diamond dielectric layer, said electrical device being operably connected to at least two of said conductive bonding pads.

13. An apparatus comprising:

a diamond substrate base;

a conductive layer disposed on an upper side of said diamond substrate base, said conductive layer being compatible with the nucleation and growth of diamond film;

a first diamond dielectric layer disposed on an upper side of said conductive layer;

a first patterned conductive layer disposed on said first diamond dielectric layer, said first patterned conductive layer being compatible with the nucleation and growth of diamond film;

a second diamond dielectric layer disposed on an upper side of said first diamond dielectric layer and covering said first patterned conductive layer;

a second patterned conductive layer disposed on said second diamond dielectric layer, said second patterned conductive layer being compatible with the nucleation and growth of diamond film;

conductive vias disposed within said second diamond layer, said conductive vias being an electrically coupling between said first patterned conductive layer and said second patterned conductive layer;

a third diamond dielectric layer disposed on an upper side of said second diamond dielectric layer and covering said second patterned conductive layer;

conductive pads disposed on an upper surface of said third diamond dielectric layer; and conductive vias disposed within said third diamond dielectric layer, said conductive vias being an electrical coupling between said second patterned conductive layer and at least one of said conductive pads.

14. An apparatus according to claim 13 further including an electrical device disposed on an upper surface of said third diamond dielectric layer, said electrical device being electrically coupled to at least two of said conductive pads.

15. An apparatus according to claim 14 in which said electrical device is an integrated device.

16. An apparatus according to claim 14 in which said electrical device is a discrete device.

17. An apparatus according to claim 13 wherein said first and second diamond dielectric layers include polycrystalline diamond.

18. An apparatus according to claim 13 in which said conductive layer includes molybdenum.

* * * * *